US010032250B2

(12) United States Patent
Mazurkewitz et al.

(10) Patent No.: US 10,032,250 B2
(45) Date of Patent: Jul. 24, 2018

(54) AUTOMATED SCAN PLANNING FOR FOLLOW-UP MAGNETIC RESONANCE IMAGING

(71) Applicant: KONINKLIJKE PHILIPS N.V., Eindhoven (NL)

(72) Inventors: Peter Mazurkewitz, Eindhoven (NL); Julien Senegas, Eindhoven (NL); Daniel Bystrov, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/547,083

(22) PCT Filed: Jan. 15, 2016

(86) PCT No.: PCT/EP2016/050705
§ 371 (c)(1),
(2) Date: Jul. 28, 2017

(87) PCT Pub. No.: WO2016/120086
PCT Pub. Date: Aug. 4, 2016

(65) Prior Publication Data
US 2018/0025466 A1  Jan. 25, 2018

(30) Foreign Application Priority Data
Jan. 30, 2015 (EP) .................................. 15153150

(51) Int. Cl.
*G06K 9/00* (2006.01)
*G06T 3/00* (2006.01)
(Continued)

(52) U.S. Cl.
CPC .......... *G06T 3/0068* (2013.01); *G01R 33/543* (2013.01); *G01R 33/56509* (2013.01);
(Continued)

(58) Field of Classification Search
USPC .................. 382/128, 131; 600/410; 707/772
See application file for complete search history.

(56) References Cited

U.S. PATENT DOCUMENTS 7,610,075 B2  10/2009  Roell
7,903,859 B2   3/2011  Boeing et al.
(Continued)

FOREIGN PATENT DOCUMENTS

WO      2014006550 A2    1/2014

OTHER PUBLICATIONS

Senegas J. et al.: "A rigid Registration Method for automated Scan Planning in Follow-up Examinations: Retrospective Analysis from Volunteer and Patient Neuro Scans", Proceedings of the International Society for Magnetic Resonance in Medicine, 20th Annual Meeting & Exhibition, May 5, 2012 (May 5, 2012), p. 2567.
(Continued)

*Primary Examiner* — Xuemei Chen

(57) ABSTRACT

An MRI system (100) acquires magnetic resonance data (158, 168) from a subject. The execution of machine-executable instructions (180, 182, 184, 186, 188) causes a processor (144) to: receive (300) a baseline medical image (152) data descriptive of one or more internal structures (126) of the subject; receive (302) a baseline scan geometry (154); acquire (304) survey magnetic resonance data (158) from the subject by controlling the magnetic resonance imaging system with survey pulse sequence data, wherein the survey pulse sequence data comprises instructions for controlling the magnetic resonance imaging system to acquire magnetic resonance data descriptive of a three-dimensional volume (124) of the subject; reconstruct (306) the survey magnetic resonance data into a three-dimensional survey image (160); calculate (308) location data by processing the three dimensional survey image with an organ detection algorithm (182), wherein the location data is
(Continued)

descriptive of a target region (128); assign (310) a predefined region of interest (130) to the three dimensional survey image using the location data; calculate (312) registration data (164) by registering the baseline medical image to the three dimensional survey image.

15 Claims, 4 Drawing Sheets

(51) Int. Cl.
G01R 33/54 (2006.01)
G01R 33/565 (2006.01)
G06T 15/08 (2011.01)
G06T 7/30 (2017.01)
G06T 7/00 (2017.01)
G06T 11/00 (2006.01)
G06T 7/73 (2017.01)

(52) U.S. Cl.
CPC .............. *G06T 7/0016* (2013.01); *G06T 7/30* (2017.01); *G06T 7/74* (2017.01); *G06T 11/008* (2013.01); *G06T 15/08* (2013.01); *G06T 2207/10088* (2013.01); *G06T 2211/40* (2013.01); *G06T 2215/16* (2013.01)

(56) References Cited

U.S. PATENT DOCUMENTS

| | | | | |
|---|---|---|---|---|
| 7,995,864 | B2 * | 8/2011 | Mullick | G06T 7/38 |
| | | | | 382/128 |
| 8,175,352 | B2 | 5/2012 | Xu et al. | |
| 8,194,950 | B2 * | 6/2012 | Bystrov | G06T 7/38 |
| | | | | 382/128 |
| 8,649,585 | B2 * | 2/2014 | Xue | G06T 5/50 |
| | | | | 382/128 |
| 9,129,426 | B2 * | 9/2015 | Gopalakrishnan | G06T 11/005 |
| 9,280,815 | B2 * | 3/2016 | Slutsky | G06T 7/0012 |
| 9,453,898 | B2 * | 9/2016 | Nielsen | G01R 33/58 |
| 9,675,311 | B2 * | 6/2017 | Von Berg | A61B 6/032 |
| 9,724,538 | B2 * | 8/2017 | Pekar | G06F 19/3481 |
| 2014/0003696 | A1 * | 1/2014 | Taghva | A61B 5/0037 |
| | | | | 382/131 |
| 2015/0006574 | A1 * | 1/2015 | Saalbach | G06F 19/321 |
| | | | | 707/772 |
| 2015/0150466 | A1 * | 6/2015 | Abi-Jaoudeh | A61B 5/015 |
| | | | | 600/424 |
| 2015/0182117 | A1 * | 7/2015 | Senegas | A61B 5/055 |
| | | | | 600/410 |
| 2015/0362575 | A1 * | 12/2015 | Ourselin | G01R 33/56536 |
| | | | | 382/131 |

OTHER PUBLICATIONS

Itti L et al; "Automatic Scan Prescription for Brain MRI",Magnetic Resonance in Medicine, John Wiley &Sons, Inc, US,vol. 45, Jan. 1, 2001 (Jan. 1, 2001),pp. 486-494.

Janet Goldenstein et al: "Prospective image registration for automated scan prescription of follow-up knee images inquantitative studies".Magnetic Resonance Imaging, Elsevier Science, Tarrytown, NY, US, vol. 29, No. 5,Feb. 20, 2011 (Feb. 20, 2011), pp. 693-700.

Verleger T.et al.:"Comparison of Rigid registration Methods for Time-of-Flight MRA datasets".Proceedings of the International Society for Magnetic Resonance in Medicine, 20th Annual Meeting and Exhibition,May 5, 2012 (May 5, 2012), p. 1031.

Martin J et al: "System for renal movement elimination and renal diagnosis supported by vague knowledge". Proceedings of the SPIE—the International Society for Optical Engineering SPIE—Int. Soc. Opt. Eng. USA,vol. 3979, 2000, pp. 1288-1294.

Pilutti D. et al.: "An Overview of Registration Methods Used for the Automatic Analysis of Abdominal DCE-MRI", Proceedings of the International Society for Magnetic Resonance in Medicine, 19th Annual Meeting,May 7, 2011 (May 7, 2011), p. 4687.

* cited by examiner

AUTOMATED SCAN PLANNING FOR FOLLOW-UP MAGNETIC RESONANCE IMAGING

CROSS REFERENCE TO RELATED APPLICATIONS

This application is a U.S. national phase application of International Application No. PCT/EP2016/050705, filed on Jan. 15, 2016, which claims the benefit of EP Application Ser. No. 15153150.6 filed on Jan. 30, 2015 and is incorporated herein by reference.

TECHNICAL FIELD OF THE INVENTION

The invention relates to magnetic resonance imaging, in particular to automatic scan planning

BACKGROUND OF THE INVENTION

In many clinical situations it is useful to make multiple medical images of a subject over an extended period of time. For example periodically imaging a cancerous tumor and measuring its size or volume can be a measure of evaluating the effectiveness of a particular therapy. A difficult is that small variations in where the medical image is made can have a huge difference in how the tumor appears in the resulting medical image. It is very critical that in such a sequence of medical images that the scan geometry of subsequent images is as close to the original as possible.

International patent application publication WO 2014/006550 A2 discloses a method of automatic scan planning for subsequent images. The method of this application is particularly useful where the anatomical region being imaged has a rigid structure. The ISMRN-2012 abstract p2567 mentions a rigid registration method for automated scan planning in follow-up examinations. The acquisition geometry of the follow-up scans is computed by applying a rigid registration between the baseline scan and a 3D survey scan at the beginning of the follow-up exam.

SUMMARY OF THE INVENTION

The invention provides for a magnetic resonance imaging system, a method of acquiring magnetic resonance data and a computer program product in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine-executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine-executable instructions or a program which causes a processor to perform an aspect of the present invention. Computer executable code for carrying out operations for aspects of the present invention may be written in any combination of one or more programming languages, including an object oriented programming language such as Java, Smalltalk, C++or the like and conventional procedural programming languages, such as the "C" programming language or similar programming languages and compiled into machine-executable instructions. In some instances the computer executable code may be in the form of a high level language or in a pre-compiled form and be used in conjunction with an interpreter which generates the machine-executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Medical image data is defined herein as two or three dimensional data that has been acquired using a medical imaging scanner. A medical imaging scanner or system is defined herein as an apparatus adapted for acquiring information about the physical structure of a patient and construct sets of two dimensional or three dimensional medical image data. Medical image data can be used to construct visualizations or medical images which are useful for diagnosis by a physician. This visualization can be performed using a computer.

Magnetic Resonance (MR) data is defined herein as being the recorded measurements of radio frequency signals emitted by atomic spins using the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect, the invention provides for a magnetic resonance imaging system for acquiring magnetic resonance data from a subject within an imaging zone. The magnetic resonance imaging system comprises a memory containing machine-executable instructions. The magnetic resonance imaging system further comprises a processor for controlling the magnetic resonance imaging system. Execution of the machine-executable instructions causes the processor to receive a baseline medical image of the subject. The baseline medical image comprises image data descriptive of an internal structure of the subject. It is understood that references to "an internal structure" may also refer to more than one internal structure. The baseline medical image could for instance be from any imaging modality that acquires a two-dimensional slice-like image of the subject. For instance the baseline medical image could be from a magnetic resonance imaging system, a CT system, or other similar system.

Execution of the machine-executable instructions further cause the processor to receive a baseline scan geometry. The baseline scan geometry may comprise data descriptive of a baseline scan geometry relative to the internal structure. The baseline scan geometry may also comprise information about the patient position in the scanner (e.g. head or feet first, prone or supine, etc.) during the baseline examination. Normally, this information is included in the Digital Imaging and Communications in Medicine (DICOM) files of the magnetic resonance imaging system.

In some examples the baseline scan geometry is the location of the slice and field of view used for creating the baseline medical image.

Execution of the machine-executable instructions further cause the processor to acquire survey magnetic resonance data from the subject by controlling the magnetic resonance imaging system with survey pulse sequence data. The survey pulse sequence data comprises instructions for controlling the magnetic resonance imaging system to acquire first magnetic resonance data descriptive of a three-dimensional volume of the subject. The survey pulse sequence data as used herein encompasses pulse sequence data which is used to perform a survey scan over a portion of the subject.

Pulse sequence data as used herein encompasses commands or data which can be translated into commands which cause the magnetic resonance imaging system to acquire magnetic resonance data according to a magnetic resonance imaging protocol. In this case the survey pulse sequence data causes the magnetic resonance imaging system to either acquire a three-dimensional image or a set of two-dimensional slices which are equivalent to a three-dimensional image. Execution of the machine-executable instructions further causes the processor to reconstruct the survey magnetic resonance data into a three-dimensional survey image.

Execution of the machine-executable instructions further cause the processor to calculate location data by processing the three-dimensional survey image with an organ detection algorithm. An organ detection algorithm as used herein is an algorithm which is used to detect the location of or the approximate location of an internal structure within the subject. For example the organ detection algorithm in one example could be an image segmentation algorithm. In another example the organ detection algorithm may be an algorithm which uses an atlas-based or a deformable model to detect the organ location. In a simpler example the organ detection algorithm could identify particular anatomical landmarks which are readily identified. The relative location of the anatomical landmark to the location of the internal structure of the subject could be roughly defined. The location data is descriptive of a target region that contains at least a portion of the internal structure within the three-dimensional survey.

Depending upon the organ detection algorithm the location data and target region may be different. For example, if the organ detection algorithm detects one or several anatomical landmarks the target region may be a location. For example the target region may be a center point or other specific location of an organ or internal structure that is located. Execution of the machine-executable instructions further cause the processor to assign a predefined region of interest to a three-dimensional survey image using the location data. For example the predefined region of interest may be defined in terms of the coordinates of the target region. Notably, said target region corresponds to a subregion in the survey image that is moveable with respect to its surrounding structure within the survey image. In particular, the registration process takes account of non-rigid deformation and movement of the subregion. Execution of the machine-executable instructions further causes the processor to calculate registration data by registering the baseline medical image to the three-dimensional survey image. The three-dimensional survey image comprises a first group of voxels that are within the predefined region of interest and a second group of voxels that are outside of the predefined region of interest.

The image registration algorithm assigns voxels within the first group of voxels a higher weighting than the second group of voxels. The registration data is descriptive of a geometric transformation of the internal structure in the baseline medical image to the three-dimensional survey image. Execution of the machine-executable instructions further causes the processor to calculate an updated scan geometry by transforming the survey scan geometry with the geometric transformation. The geometric transformation may provide information which can be use on how to change or transform the scan geometry in a way to match that of the survey scan geometry.

Execution of the machine-executable instructions further cause the processor to acquire follow-up magnetic resonance data from the subject by controlling the magnetic resonance imaging system with the follow-up pulse sequence data. The follow-up pulse sequence data comprises instructions for controlling the magnetic resonance imaging system to acquire the follow-up magnetic resonance data using the updated scan geometry. This embodiment may have the benefit that the follow-up magnetic resonance data is more accurately acquired with the same geometry as the baseline medical image. When the follow-up magnetic resonance data is reconstructed into an image, this may allow a more accurate comparison of the baseline medical image and the resulting magnetic resonance image.

In another embodiment, the image registration algorithm is initialized using the location data. This may enable the image registration algorithm to either function more rapidly and/or to more accurately find the location of the registration between the baseline medical image and the three-dimensional survey image.

In another embodiment, the image registration algorithm assigns voxels within the first group of voxels to a higher weighting than the second group of voxels by masking out the second group of voxels. In this embodiment, the second group of voxels are ignored during the registration of the baseline medical image to the three-dimensional survey image.

In another embodiment, the image registration algorithm assigns voxels within the first group a first weighting value. The image registration algorithm assigns voxels within the second group a second weighting value. The first weighting value is higher than the second weighting value.

In another embodiment, the first weighting value decreases as a function of distance from the target region. For example if the target region is a known anatomical landmark this may enable very accurate registration of the baseline medical image to the three-dimensional survey image.

In some examples, the weighting value may be proportional from the distance to the target region.

In other examples, the weighting of the second group of voxels may be also dependent upon the distance from the target region to the particular voxels of the second group.

In another embodiment, the organ detection algorithm is a detection algorithm based on a trained classifier.

In another embodiment, the organ detection algorithm is a template matching algorithm.

In another embodiment, the organ detection algorithm is an atlas-based registration algorithm.

In another embodiment, the organ detection algorithm is a deformable model segmentation algorithm.

In another embodiment, the organ detection algorithm is a parametric deformable model segmentation algorithm.

In another embodiment, the organ detection algorithm is a geometric deformable model segmentation algorithm.

In another embodiment, the organ detection algorithm is an atlas-based segmentation algorithm.

In another embodiment, the image registration algorithm is an algorithm which uses a rigid registration. This may be useful because the rigid registration may directly provide a geometry plan or the updated scan geometry. For example a rigid registration may provide a location off center and an angulation which can be used for where a slice of MRI data should be acquired from.

In other examples, the registration algorithm is for a non-rigid registration.

In another embodiment, excitation of the machine-executable instructions further cause the processor to acquire baseline medical image by controlling a medical imaging system to acquire the baseline medical image data using the baseline scan geometry.

In another embodiment, execution of the machine-executable instructions further cause the processor to reconstruct the baseline medical image from the baseline medical image data. The medical imaging system could be for example a CT system or a magnetic resonance imaging system.

In another embodiment, excitation of the machine-executable instructions further cause the processor to acquire a baseline magnetic resonance data by controlling the magnetic resonance imaging system with baseline pulse sequence data. The baseline pulse sequence data comprises instructions for controlling the magnetic resonance imaging system to acquire magnetic resonance data using the baseline scan geometry. Execution of the machine-executable instructions further cause the processor to reconstruct the baseline magnetic resonance image from the baseline magnetic resonance data.

In another embodiment the a baseline medical image is a baseline magnetic resonance image.

In another embodiment, the baseline medical image and the baseline scan geometry are received from a computer storage.

In another embodiment, the baseline medical image and the baseline scan geometry are received from a medical imaging system.

In another embodiment, the baseline medical image and/or the baseline scan geometry are received from a PACS or picture archiving and communication system.

In another embodiment, the baseline medical image and/or the baseline scan geometry are received from a server via a network connection.

In another embodiment, the baseline medical image has a first resolution. The three-dimensional survey image has a second resolution. The first resolution is higher than the second resolution. The baseline medical image may be considered to be a low resolution magnetic resonance image.

In another embodiment, execution of the machine-executable instructions further causes the processor to reconstruct the follow-up magnetic resonance data into a follow-up magnetic resonance image.

In another embodiment, execution of the machine-executable instructions further causes the processor to display the follow-up magnetic resonance image and the baseline medical image on a display. This may include displaying them side-by-side or even overlaying or superimposing one image upon the other so that it is in a format that enables easy comparison of the two images.

In another aspect, the invention provides for a method of acquiring magnetic resonance data. The method comprises the step of receiving a baseline medical image of a subject. The baseline medical image comprises image data descriptive of an internal structure of the subject. The method further comprises receiving a baseline scan geometry. The baseline scan geometry comprises data descriptive of a baseline scan geometry relative to the internal structure. The method further comprises the step of acquiring survey magnetic resonance data from the subject by controlling a first magnetic resonance imaging system with survey pulse sequence data. The survey pulse sequence data comprises instructions for controlling the magnetic resonance imaging system to acquire magnetic resonance data descriptive of a three-dimensional volume of the subject. The method further comprises reconstructing the survey magnetic resonance data into a three-dimensional survey image.

The method further comprises the step of calculating location data by processing the three-dimensional survey image with an organ detection algorithm. The location data is descriptive of a target region that contains at least a portion of the internal structure within the three-dimensional internal structure. The method further comprises assigning a predefined region of interest to the three-dimensional survey image using the location data. The method further comprises the step of calculating registration data by registering the baseline medical image to the three-dimensional survey image using an image registration algorithm.

The three-dimensional survey image comprises a first group of voxels that are within the predefined region of interest and a second group of voxels that are outside of the predefined region of interest. The image registration algorithm assigns voxels within the first group of voxels at a higher weighting than the second group of voxels. The registration data is descriptive of a geometric transformation of the internal structure in the baseline medical image to the three-dimensional survey image. The method further comprises the step of calculating updated scan geometry by transforming the survey scan geometry with the geometric transformation. The method further comprises the step of acquiring follow-up magnetic resonance data from the subject by controlling the first magnetic resonance imaging system with follow-up pulse sequence data. The follow-up pulse sequence data comprises instructions for controlling the first magnetic resonance imaging system to acquire the follow-up magnetic resonance data using the updated scan geometry.

In another embodiment, the method further comprises the step of acquiring baseline magnetic resonance data by controlling a second magnetic resonance imaging system with baseline pulse sequence data. The baseline pulse sequence data comprises instructions for controlling the magnetic resonance imaging system to acquire the baseline magnetic resonance data using the baseline scan geometry. The method further comprises the step of reconstructing the baseline medical image from the baseline magnetic resonance data.

In another embodiment, the first magnetic resonance imaging system and the second magnetic resonance imaging system are the same magnetic resonance imaging system.

In another embodiment, the first magnetic resonance imaging system and the second magnetic resonance imaging system are different magnetic resonance imaging systems.

In another embodiment, the method further comprises waiting for a predetermined period of time between acquiring the baseline magnetic resonance imaging data and the survey magnetic resonance data.

In another embodiment, the predetermined period is greater than 1 minute.

In another embodiment, the predetermined period is greater than 1 hour.

In another embodiment, the predetermined period is greater than 1 day.

In another embodiment, the predetermined period is greater than 1 week.

In another embodiment, the predetermined period is greater than 1 month.

In another embodiment, the predetermined period is greater than 6 months.

In another embodiment, the predetermined period is greater than 1 year.

In another aspect, the invention provides a computer program product comprising machine-executable instructions for execution by a processor controlling a magnetic resonance imaging system. Execution of the machine-executable instructions causes the processor to receive a baseline magnetic resonance image of the subject. The baseline magnetic resonance image comprises image data descriptive of an internal structure of the subject. Execution of the machine-executable instructions further cause the processor to receive a baseline scan geometry. The baseline scan geometry comprises data descriptive of a baseline scan geometry relative to the internal structure. Execution of the machine-executable instructions further cause the processor to acquire survey magnetic resonance data from the subject by controlling the magnetic resonance imaging system with survey pulse sequence data. The survey pulse sequence data comprises instructions for controlling the magnetic resonance imaging system to acquire magnetic resonance data descriptive of a three-dimensional volume of the subject.

Execution of the machine-executable instructions further causes the processor to reconstruct the survey magnetic resonance data into a three-dimensional survey image. Execution of the machine-executable instructions further cause the processor to calculate location data by processing the three-dimensional survey image with an organ detection algorithm. The location data is descriptive of a target region that contains at least a part of the internal structure. Execution of the machine-executable instructions further cause the processor to assign a predefined region of interest to the three-dimensional survey image using the location data. Execution of the machine-executable instructions further cause the processor to calculate registration data by registering the baseline magnetic resonance image to the three-dimensional survey image using an image registration algorithm. The three-dimensional survey image comprises a first group of voxels that are within the predefined region of interest and a second group of voxels that are outside of the predefined region of interest.

The image registration algorithm assigns voxels within the first group of voxels at a higher weighting than the second group of voxels. The registration data is descriptive of a geometric transformation of the internal structure of the baseline magnetic resonance image to the three-dimensional survey image. Execution of the machine-executable instructions further cause the processor to calculate an updated scan geometry by transforming the survey scan geometry with the geometric transformation. Execution of the machine-executable instructions further cause the processor to acquire follow-up magnetic resonance data from the subject by controlling the magnetic resonance imaging system with follow-up pulse sequence data. The follow-up pulse sequence data comprises instructions for controlling the magnetic resonance imaging system to acquire magnetic resonance data using the updated scan geometry.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
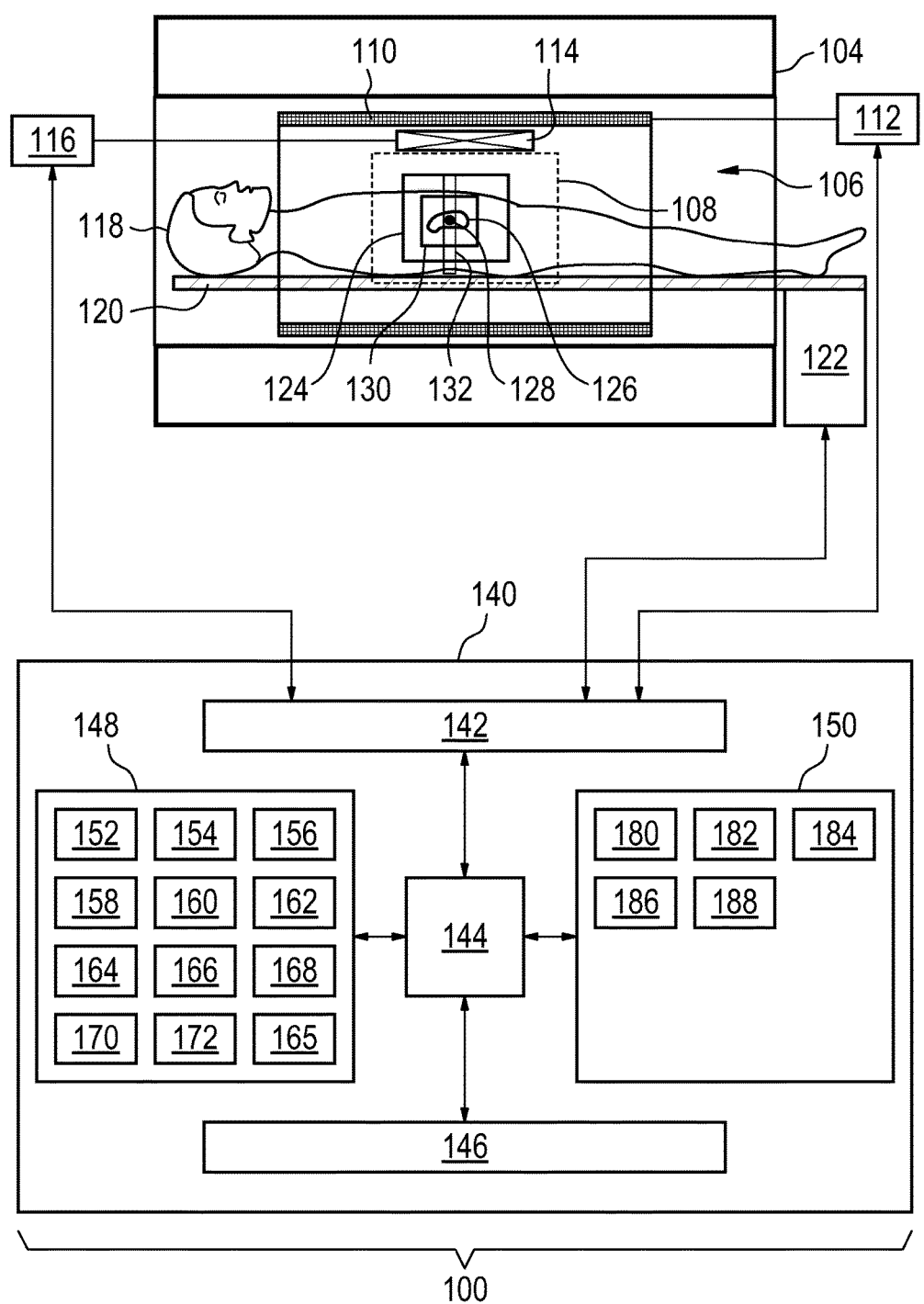
FIG. 1 illustrates an example of a magnetic resonance imaging system.

FIG. 1 shows an example of a magnetic resonance imaging system 100 with a magnet 104. The magnet 104 is a superconducting cylindrical type magnet 104 with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet, there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels.

Within the bore 106 of the magnet 104 there is a subject support 120 which is attached to an optional actuator 122 that is able to move the subject support and the subject 118 through the imaging zone 108. Within the imaging zone 108 there can be seen a three-dimensional volume 124. The three-dimensional volume 124 corresponds with the volume imaged by a conventional survey image. There is an internal structure 126 within the subject 118. A target region 128 has been identified within the internal structure 126. This may be used to identify and place a predefined region of interest 130 that corresponds to the coordinates or location of the target region 128 and/or the location of the internal structure 126. The block 132 shows the location of a subsequent follow-up magnetic resonance image.

The transceiver 116, the magnetic field gradient coil power supply 112 and the actuator 122 are all see as being connected to a hardware interface 142 of computer system 140. The computer system 140 further comprises a processor 144. The processor 144 is connected to the hardware interface 142. The hardware interface 142 enables the processor 144 to send and receive data and commands to the magnetic resonance imaging system 100. The computer system 140 further comprises a user interface 146, computer storage 148 and computer memory 150 that are in communication with the processor 144.

The contents of the computer storage 134 and the computer memory 136 may be interchangeable. In some examples the contents of the computer storage 134 may be duplicated in the computer memory 136.

The computer storage 148 is shown as containing a baseline medical image 152. The computer storage 148 is also shown as containing a baseline scan geometry 154. The computer storage 148 is further shown as containing survey pulse sequence data 156. The survey pulse sequence data specifies a survey scan geometry 165, which is also shown as being stored in the computer storage 148. The computer storage is further shown as containing a three-dimensional survey image 160 that was acquired by controlling the magnetic resonance imaging system 100 with the survey pulse sequence data 156. The volume 124 corresponds to the volume imaged by the three-dimensional survey image 160. The computer storage 148 further contains location data 162 that is descriptive of the location of the target region 128 and/or the internal structure 126. The computer storage 148 is further shown as containing registration data 164 that was obtained by registering the baseline medical image 152 to the three-dimensional survey image 160.

The computer storage 148 is further shown as containing an updated scan geometry 166 that was calculated from the survey scan geometry by transforming or modifying it using the registration data 164. The registration data 164 contains a mapping of the internal structure 126 in the baseline medical image 152 to the three-dimensional survey image 160. The computer storage 148 is further shown as containing a follow-up pulse sequence data 168. The follow-up pulse sequence data 168 contains instructions that cause the magnetic resonance imaging system 100 to image a volume defined by the updated scan geometry 166. In this case the updated scan geometry 166 causes a magnetic resonance image slice to be imaged at the location of the block labeled 132. The computer storage 148 is further shown as containing a follow-up magnetic resonance image 170 that was constructed from the follow-up pulse sequence data 168. The computer storage 148 is further shown as containing an image rendering 172 that contains a rendering of the follow-up magnetic resonance image 170 and the baseline medical image 152. The rendering for instance may have the images side-by-side or may superimpose them so that the change in the internal structure 126 between the two images is visible.

The computer memory 150 is shown as containing a control module 180. The control module contains computer executable code which enables the processor 144 to control the operation and function of the magnetic resonance imaging system 100. The computer memory 150 is further shown as containing an organ detection algorithm 182 that enables the processor to locate the internal structure 126 and/or the target region 128 in the three-dimensional survey image 160. The organ detection algorithm 182 may also determine the location data 162. The processor is programmed to use the location data 162 to calculate the location of the predefined region of interest 130. The computer memory 150 is further shown as containing a registration module 184. The registration module 184 contains computer executable code, which enables the processor 144 to register the baseline medical image 152 to the three-dimensional survey image 160.

The baseline medical image 152 for instance may be a two-dimensional image. This is an image registration of a two-dimensional image to a three-dimensional image. The computer memory 150 is further shown as containing an image reconstruction module 186 which enables reconstruction of the various magnetic resonance data 158, 168 into magnetic resonance images 160, 170. The computer memory 150 is further shown as containing a scan geometry calculation module 188 which enables the processor 144 to transform the survey scan geometry 165 into the updated scan geometry 166 using the registration data 164.

Figure 2:
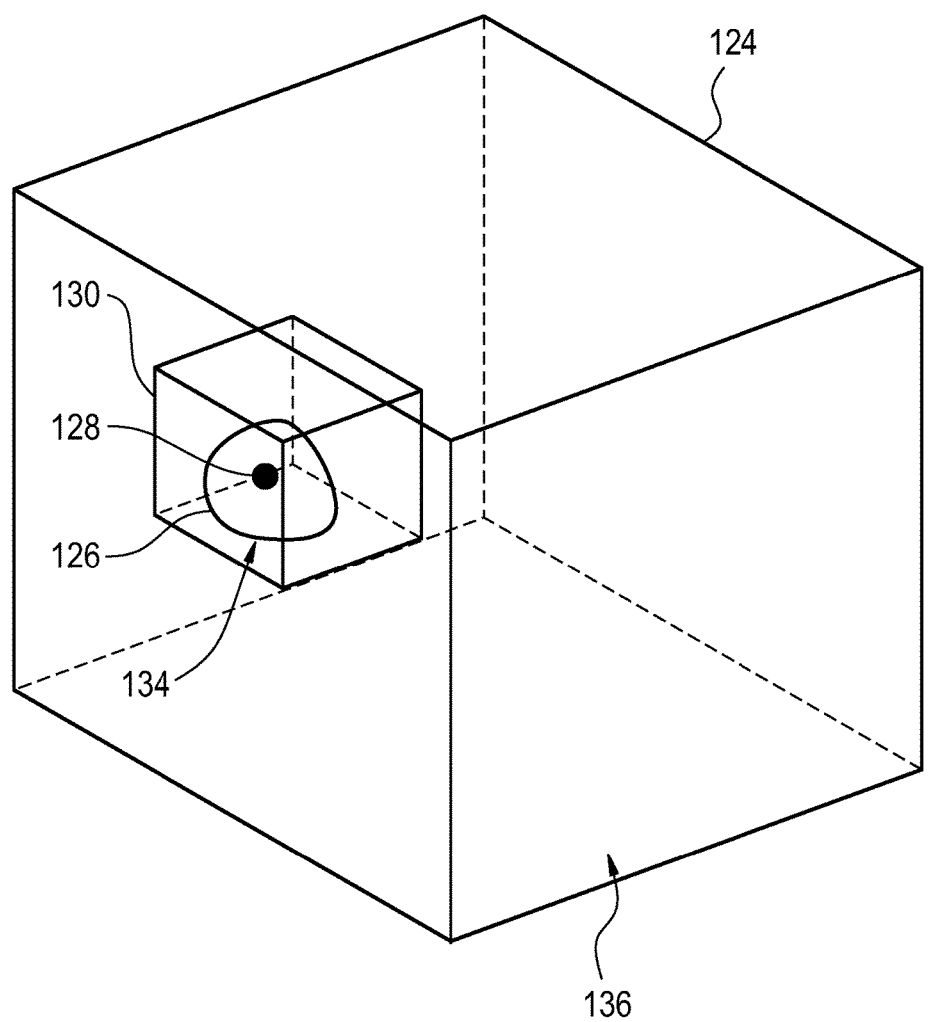
FIG. 2 shows a detail drawing of several volumes within imaging zone of the magnetic resonance imaging system of FIG. 1.

FIG. 2 illustrates some of the geometric volumes of FIG. 1. In particular FIG. 2 shows a relationship of the three-dimensional volume 124 to the predefined region of interest 130. The three-dimensional volume 124 is represented in FIG. 2 as a rectangular volume. Within the volume 124 is located the internal structure 126. After the three-dimensional survey image 160 is reconstructed the organ detection algorithm 182 detects the location of the internal structure 126 and/or the target region 128. The target region could be for instance one or more anatomical reference points which are easily detected. The position of the target region 128 and in some instances the location of the internal structure 126 are then used to position a predefined region of interest 130 relative to the coordinates of the target region 128 and/or the internal structure 126.

The predefined region of interest 130 is made large enough so that it is able to encompass at least a portion of the internal structure 126. The registration module 184 then takes the volumes defined by the three-dimensional volume 124 and the predefined region of interest 130 into account. Voxels that are located within the predefined region of interest 130 are given a weighting factor that is higher than voxels which are within the three-dimensional volume only. This defines a first group of voxels within the predefined region of interest 130 and a second group of voxels 136 that are within the three-dimensional volume 124. Voxels that are a member of the first group of voxels 134 are not members of the second group of voxels 136. The weighting factor to the voxels in the first group 134 and the second group 136 may be assigned in different ways.

In one example all the voxels in the first group 134 have a higher value than in the second group 136. Constant values may be assigned. In another example voxels in the second group 136 are ignored completely in the image registration. In another example the distance from the target region 128 are used to calculate a weighting factor that depends upon the distance from the target region 128. In this example the predefined region of interest 130 is shown as a rectangular volume. This however does not need to be the case. For example the defined region of interest could be defined by a sphere which has its shape defined by a distance from the target region 128. In other examples a deformable shape model may be used for instance to define the outline of the internal structure 126. This volume of the internal structure could then be used also as the predefined region of interest 130.

Figure 3:
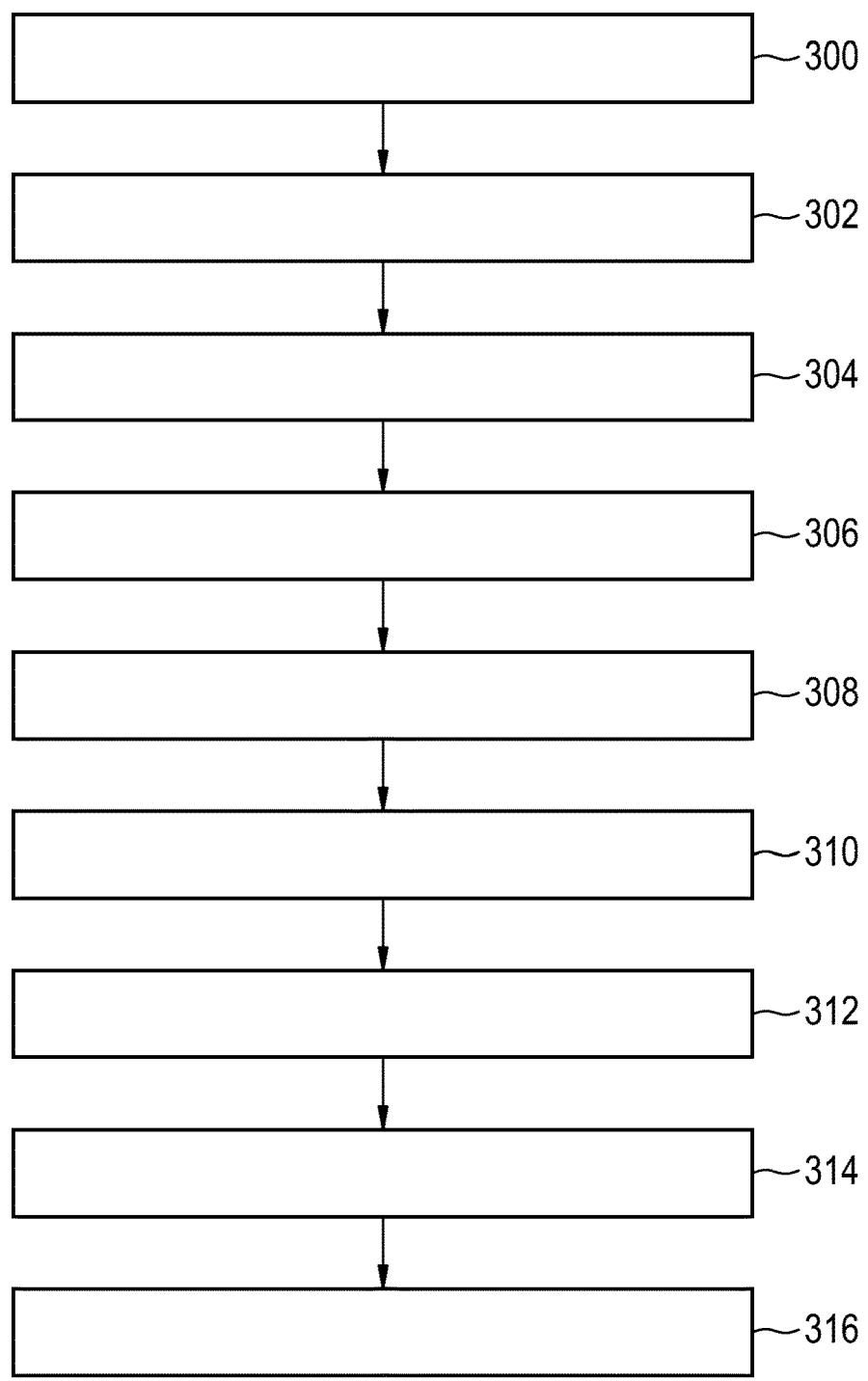
FIG. 3 shows a flow chart which illustrates a method of using the magnetic resonance imaging system of FIG. 1.

FIG. 3 shows a flowchart which illustrates a method of operating the magnetic resonance imaging system of FIG. 1. First in step 300 first the baseline image 152 of the subject 118 is received. Next in step 302 the baseline scan geometry 154 is received. The baseline medical image 152 and the baseline scan geometry 154 could for example be received from the memory 148 or from an external server or network connection. Next in step 304 survey magnetic resonance data 158 is acquired by controlling the magnetic resonance imaging system 100 with the survey pulse sequence data 156. Next in step 306 the survey magnetic resonance data 158 is reconstructed into the three-dimensional survey image 160. In step 308 location data 162 is calculated by processing the three-dimensional survey image 160 with the organ detection algorithm 182.

Next in step 310 the predefined region of interest 130 is assigned to the three-dimensional survey image 160 using the location data 162. In step 312 the registration data 164 is calculated by registering the baseline medical image 152 to the three-dimensional survey image 160. The three-dimensional survey image comprises the first group of voxels 134 and the second group of voxels 136. The image registration algorithm 184 assigns voxels within the first group of voxels 134 a higher weighting than the second group of voxels 136. In step 314 the scan geometry calculation module 188 calculates the updated scan geometry 166 using the registration data 164 and the survey scan geometry. Finally in step 316 the follow-up magnetic resonance data 168 is acquired by controlling the magnetic resonance imaging system 100 with the follow-up pulse sequence data 168. The follow-up pulse sequence data 168 was created by the processor 144 using the updated scan geometry 166.

When reading or acquiring images of a follow-up examination, it is often desirable for the reading radiologist to compare slice by slice the images of the baseline and follow-up scans. Hence, it is highly desirable to acquire the images of the follow-up exam in the exact same geometry with respect to the target anatomy as the baseline exam.

Recently, a new method, named "re-scan", was proposed to handle this challenge. Re-scan is based on the registration of the baseline diagnostic scan images with a 3D follow-up survey. This method works well for organs mainly characterized by rigid body motion, such as the brain, and when baseline and follow-up images have comparable field-of-view. For body organs like prostate, liver or kidney, these conditions are often not met. Especially, the high-resolution diagnostic scans often have a small field-of-view as compared to the corresponding 3D survey.

Examples as described herein may improve the robustness and accuracy of the re-scan method in these more challenging cases.

Examples may have one or more of the following features:
  Acquisition of a fast, 3D survey scan.
  Automatic, image-based localization of the target organ using very fast classification methods and definition of a corresponding region-of-interest (ROI).
  Registration between the selected baseline images and the 3D follow-up survey, whereby voxels of the automatic detected ROI take greater account compared to the surrounding area and the registration is initialized at the detected ROI center.
  Based on the geometric transformation computed by the registration software, visualization of the proposed geometry plan on top of the survey image (like in the normal geometry planning environment). This scan plan can be directly taken over or manually adapted.

With examples as described herein, even small anatomic areas can be possibly registered very robustly to the follow-up survey, so that alignment of the scans in case of patient re-scan becomes much more stable and accurate.

When reading images of a follow-up examination, it is often desirable for the reading radiologist to compare slice by slice the images of the baseline and follow-up scans. Hence, it is highly desirable to prospectively acquire the images of the follow-up exam in the exact same geometry with respect to the target anatomy as the baseline exam.

Problems or disadvantages overcome by the invention For body organs like prostate, liver or kidney, the above conditions are often not met. Due to internal non-rigid deformations, the target organ may be differently positioned with respect to the surrounding anatomical structures. For example, in the case of the prostate, bladder and rectum filling can significantly displace the prostate. Moreover, high-resolution prostate scans generally have a restricted field-of-view which does not cover the complete pelvis, as opposed to the survey scan. In these conditions, the registration of baseline, high-resolution and survey scans is prone to instability, as the registration may be attracted to a local minimum solution.

Examples may include one or more of the following steps or features:
  (step 1): First, a (or several) baseline scan needs to be selected. The specific method to select this baseline scan is not part of the invention. The follow-up examination starts with a 3D survey. This scan is generally short (less than 1 minute). The automated alignment of the 3D survey and the baseline scan starts automatically
  (step 2): In a first step, the approximate location of the target organ is detected, e.g. by means of an image-based classifier. Based on this detection, a region of interest including the target organ is then automatically defined, for example using statistical estimates of the organ size.
  (step 3): Next, the baseline and follow-up scans are registered, whereby voxels of the automatic detected Region of Interest (ROI) take greater account compared to the surrounding area in the registration process and the registration is initialized at the detected ROI center. For example, the voxels comprised in the detected ROI may have a larger weight than those outside the ROI, so that the registration process is mainly driven by the voxels inside the ROI. In another embodiment, the voxels outside the detected ROI are masked out. The computed resulting geometric transformation is then applied to visualize the position of the geometry plan on the 3D survey images (step 4). After approval or modification by the operator, the scans of the follow-up exam are acquired. As a result of the automated scan planning, follow-up and baseline are well aligned.

The selection of the scan to be used as reference can be done manually by the operator, or can be done automatically by the planning system.

Figure 4:
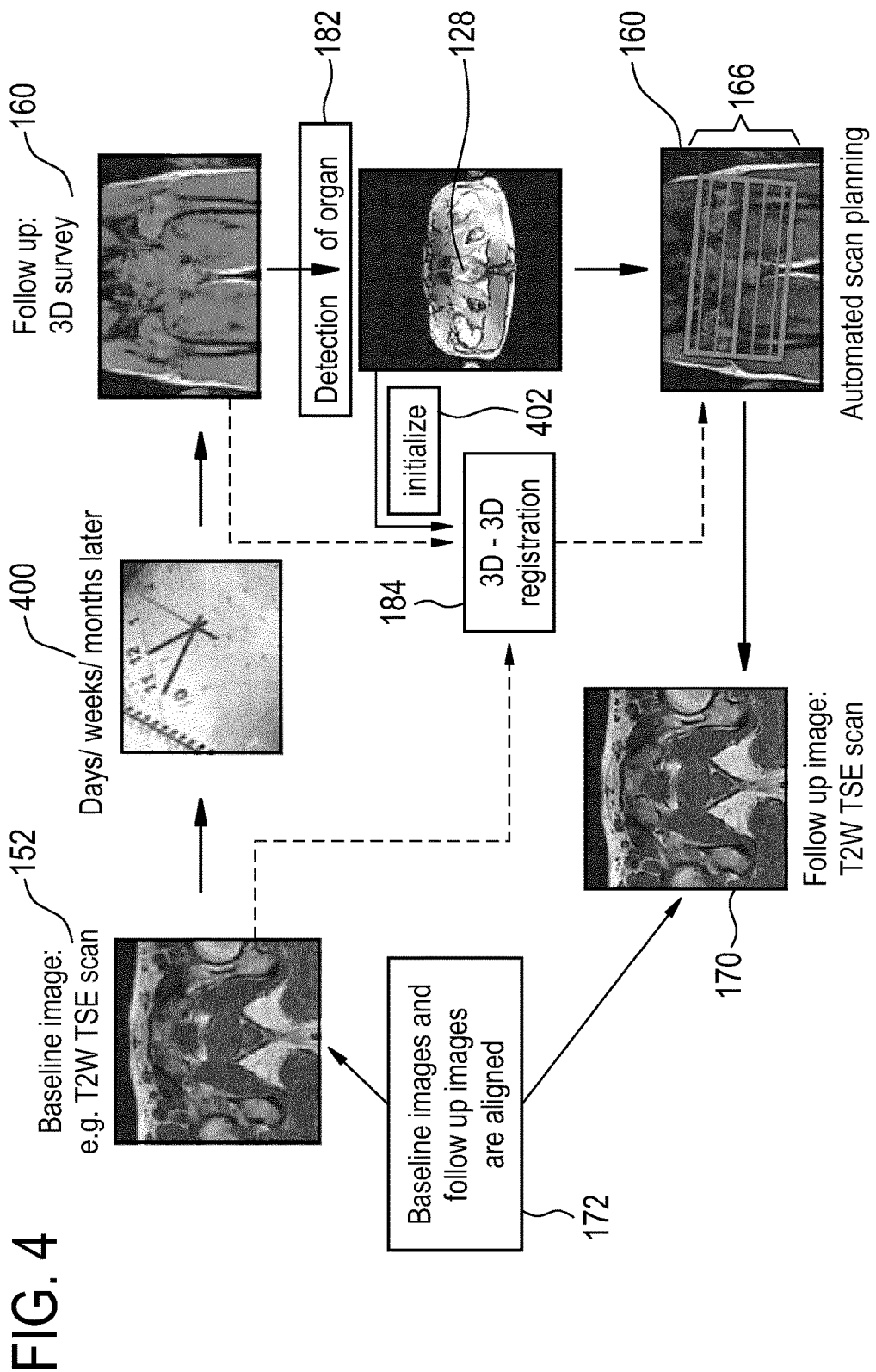
FIG. 4 shows a schematic representation of a method of operating the magnetic resonance imaging system of FIG. 1.

FIG. 4 shows a schematic representation of a method of operating the magnetic resonance imaging system of FIG. 1. The image labeled 152 represents the baseline medical image. The block 400 represents a delay between acquiring the baseline medical image 152 and the three-dimensional survey image 160. After the three-dimensional survey image 160 is acquired the organ detection algorithm 182 detects the location of the organ or internal structure 126 or in this case the target region 128 which is labeled as a point in the image below the detection of the organ 182. Block 402 represents that the location data determined during the registration may be used to initiate the registration module 184. The registration module 184 uses the baseline image 152, the three-dimensional survey image 160, possibly the initialization 402 and the weightings of the first group of voxels and the second group of voxels. This is then used to generate an updated scan geometry 166 which is shown as being superimposed on the image 160. The scan geometry 166 is then used as a scan geometry to acquire and reconstruct the follow-up magnetic resonance image 170. The baseline image 152 and the follow-up image 170 may then be aligned or rendered together and rendered as an image 172.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance system
104 magnet
106 bore of magnet
108 measurement zone or imaging zone
110 magnetic field gradient coils
112 magnetic field gradient coil power supply
114 radio-frequency coil
116 transceiver
118 subject
120 subject support
122 actuator
124 three-dimensional volume
126 internal structure
128 target region
130 predefined region of interest
132 slice location
134 first group of voxels
136 second group of voxels
140 computer system
142 hardware interface
144 processor
146 user interface
148 computer storage
150 computer memory
152 baseline medical image
154 baseline scan geometry
156 survey pulse sequence data
158 survey magnetic resonance data
160 three-dimensional survey image
162 location data
164 registration data
165 survey scan geometry
166 updated scan geometry
168 follow-up pulse sequence data
170 follow-up magnetic resonance image
172 image rendering
180 control module
182 organ detection algorithm
184 registration module
186 image reconstruction module
188 scan geometry calculation module
300 receive a baseline magnetic resonance image of a subject
302 receive a baseline scan geometry
304 acquire survey magnetic resonance data from the subject by controlling the magnetic resonance imaging system with survey pulse sequence data
306 reconstruct the survey magnetic resonance data into a three-dimensional survey image
308 calculate location data by processing the three dimensional survey image with an organ detection algorithm
310 assign a predefined region of interest to the three dimensional survey image using the location data;
312 calculate registration data by registering the baseline magnetic resonance image to the three dimensional survey image
314 calculate an updated scan geometry by transforming the survey scan geometry with the geometric transformation
316 acquire follow-up magnetic resonance data from the subject by controlling the magnetic resonance imaging system with survey pulse sequence data
400 delay
402 initialization of registration

The invention claimed is:

1. A magnetic resonance imaging system for acquiring magnetic resonance data from a subject within an imaging zone, wherein the magnetic resonance imaging system comprises:

a memory containing machine-executable instructions;

a processor for controlling magnetic resonance imaging system, wherein execution of the machine-executable instructions causes the processor to:

receive a baseline medical image of the subject, wherein the baseline medical image comprises image data descriptive of one or more internal structures of the subject;

receive a baseline scan geometry, wherein the baseline scan geometry comprises data descriptive of a baseline scan geometry relative to the one or more internal structures;

acquire survey magnetic resonance data from the subject by controlling the magnetic resonance imaging system with survey pulse sequence data, wherein the survey pulse sequence data comprises instructions for controlling the magnetic resonance imaging system to acquire magnetic resonance data descriptive of a three-dimensional volume of the subject according to a survey scan geometry;

reconstruct the survey magnetic resonance data into a three-dimensional survey image;

calculate location data by processing the three-dimensional survey image with an organ detection algorithm, wherein the location data is descriptive of a target region that contains at least a portion of the one or more internal structures; and said target region corresponds to a subregion in the survey image that is moveable with respect to its surrounding structure within the survey image;

assign a predefined region of interest to the three-dimensional survey image using the location data;

calculate registration data by registering the baseline medical image to the three-dimensional survey image using an image registration algorithm, wherein the three-dimensional survey image comprises a first group of voxels that are within the predefined region of interest and a second group of voxels that are outside of the predefined region of interest, wherein the image registration algorithm assigns voxels within the first group of voxels a higher weighting than the second group of voxels, wherein the registration data is descriptive of a geometric transformation of the one or more internal structures in the baseline medical image to the three-dimensional survey image;

calculate an updated scan geometry by transforming the survey scan geometry with the geometric transformation; and acquire follow-up magnetic resonance data from the subject by controlling the magnetic resonance imaging system with follow-up pulse sequence data, wherein the follow-up pulse sequence data comprises instructions for controlling the magnetic resonance imaging system to acquire the follow-up magnetic resonance data using the updated scan geometry.

2. The magnetic resonance imaging system of claim 1, wherein the image registration algorithm assigns voxels within the first group of voxels a higher weighting than the second group of voxels by masking out the second group of voxels.

3. The magnetic resonance imaging system of claim 1, wherein the image registration algorithm assigns voxels within the first group a first weighting value, wherein the image registration algorithm assigns voxels within the second group a second weighting value, wherein the first weighting value is higher than the second weighing value.

4. The magnetic resonance imaging system of claim 3, wherein the first weighting value decreases as a function of a distance from the target region.

5. The magnetic resonance imaging system of claim 1, wherein the organ detection algorithm is any one of the following: a detection algorithm based on trained classifier, a template matching algorithm, an atlas-based registration algorithm, a deformable model segmentation algorithm, a parametric deformable model segmentation algorithm, a geometric deformable model segmentation algorithm, and an atlas-based segmentation algorithm.

6. The magnetic resonance imaging system of claim 1, wherein execution of the machine-executable instructions further causes the processor to:

acquire baseline medical image data by controlling a medical imaging system to acquire the baseline medical image data using the baseline scan geometry; and reconstruct the baseline medical image from the baseline medical image data.

7. The magnetic resonance imaging system of claim 1, wherein the baseline medical image and the baseline scan geometry are received from any one of the following: a computer storage device, a medical imaging system, a picture achieving and communications system (PACS) system, and a server via a network connection.

8. The magnetic resonance imaging system of claim 1, wherein execution of the machine-executable instructions further causes the processor to reconstruct the follow-up magnetic resonance data into a follow-up magnetic resonance image.

9. The magnetic resonance imaging system of claim 8, wherein execution of the machine executable instructions causes the processor to display the follow-up magnetic resonance image and the baseline medical image on a display.

10. The magnetic resonance imaging system of claim 1, wherein execution of the machine-executable instructions causes the processor to initialize the registration algorithm using the location data.

11. A method of acquiring magnetic resonance data with a magnetic resonance imaging system, wherein the method comprises the steps of:

receiving a baseline medical image of a subject, wherein the baseline medical image comprises image data descriptive of one or more internal structures of the subject;

receiving a baseline scan geometry, wherein the baseline scan geometry comprises data descriptive of a baseline scan geometry relative to the one or more internal structures;

acquiring survey magnetic resonance data from the subject by controlling the magnetic resonance imaging system with survey pulse sequence data, wherein the survey pulse sequence data comprises instructions for controlling the magnetic resonance imaging system to acquire magnetic resonance data descriptive of a three-dimensional volume of the subject according to a survey scan geometry;

reconstructing the survey magnetic resonance data into a three-dimensional survey image;

calculating location data by processing the three-dimensional survey image with an organ detection algorithm, wherein the location data is descriptive of a target region that contains at least a portion of the one or more internal structures and said target region corresponds to a subregion in the survey image that is moveable with respect to its surrounding structure within the survey image;

assigning a predefined region of interest to the three-dimensional survey image using the location data;

calculating registration data by registering the baseline medical image to the three-dimensional survey image using an image registration algorithm, wherein the three-dimensional survey image comprises a first group of voxels that are within the predefined region of interest and a second group of voxels that are outside of the predefined region of interest, wherein the image registration algorithm assigns voxels within the first group of voxels a higher weighting than the second group of voxels, wherein the registration data is descriptive of a geometric transformation of the one or more internal structures in the baseline medical image to the three-dimensional survey image;

calculating an updated scan geometry by transforming the survey scan geometry with the geometric transformation; and acquiring follow-up magnetic resonance data from the subject by controlling the magnetic resonance imaging system with follow-up pulse sequence data, wherein the follow-up pulse sequence data comprises instructions for controlling the magnetic resonance imaging system to acquire the follow-up magnetic resonance data using the updated scan geometry.

12. The method of claim 11, wherein the method further comprises the steps of:

acquiring baseline magnetic resonance data by controlling a second magnetic resonance imaging system with baseline pulse sequence data, wherein the baseline pulse sequence data comprises instructions for controlling the second magnetic resonance imaging system to acquire the baseline magnetic resonance data using the baseline scan geometry; and reconstructing the baseline medical image from the baseline magnetic resonance data.

13. The method of claim 12, wherein the first magnetic resonance imaging system and the second magnetic resonance imaging system are the same magnetic resonance imaging system.

14. The method of claim 12, wherein the method further comprises waiting for a predetermined period of time between acquiring the baseline magnetic resonance imaging data and the survey magnetic resonance data, wherein the predetermined period of time is any one of the following: greater than one minute, greater than one hour, greater than one day, greater than one week, greater than one month, greater than six months, and greater than one year.

15. A non-transitory computer-readable medium carrying machine-executable instructions which when executed by a processor control a magnetic resonance imaging system to:

receive a baseline medical image of a subject, wherein the baseline medical image comprises image data descriptive of one or more internal structures of the subject;

receive a baseline scan geometry, wherein the baseline scan geometry comprises data descriptive of a baseline scan geometry relative to the one or more internal structures;

acquire survey magnetic resonance data from the subject by controlling the magnetic resonance imaging system with survey pulse sequence data, wherein the survey pulse sequence data comprises instructions for controlling the magnetic resonance imaging system to acquire magnetic resonance data descriptive of a three-dimensional volume of the subject according to a survey scan geometry;

reconstruct the survey magnetic resonance data into a three-dimensional survey image;

calculate location data by processing the three-dimensional survey image with an organ detection algorithm, wherein the location data is descriptive of a target region that contains at least a portion of the one or more internal structures and said target region corresponds to a subregion in the survey image that is moveable with respect to its surrounding structure within the survey image;

assign a predefined region of interest to the three-dimensional survey image using the location data;

calculate registration data by registering the baseline medical image to the three-dimensional survey image using an image registration algorithm, wherein the three-dimensional survey image comprises a first group of voxels that are within the predefined region of interest and a second group of voxels that are outside of the predefined region of interest, wherein the image registration algorithm assigns voxels within the first group of voxels a higher weighting than the second group of voxels, wherein the registration data is descriptive of a geometric transformation of the one or more internal structures in the baseline medical image to the three-dimensional survey image;

calculate an updated scan geometry by transforming the survey scan geometry with the geometric transformation; and acquire follow-up magnetic resonance data from the subject by controlling the magnetic resonance imaging system with follow-up pulse sequence data, wherein the follow-up pulse sequence data comprises instructions for controlling the magnetic resonance imaging system to acquire the follow-up magnetic resonance data using the updated scan geometry.

* * * * *